(12) United States Patent
Lee et al.

(10) Patent No.: US 6,723,186 B2
(45) Date of Patent: Apr. 20, 2004

(54) METHOD OF MANUFACTURING METALLIC FILM CONSISTING OF GIANT SINGLE CRYSTAL GRAINS

(75) Inventors: Dong Su Lee, Seoul (KR); Dong Yeon Park, Seoul (KR); Hyun Jung Woo, Kyunggi-Do (KR); Seung Hyun Kim, Seoul (KR); Jowoong Ha, Seoul (KR); Eui Joon Yoon, Seoul (KR)

(73) Assignee: Inostek Inc., Seoul (KR)

( * ) Notice: Subject to any disclaimer, the term of this patent is extended or adjusted under 35 U.S.C. 154(b) by 0 days.

(21) Appl. No.: 09/918,296

(22) Filed: Jul. 30, 2001

(65) Prior Publication Data

US 2002/0015793 A1 Feb. 7, 2002

(30) Foreign Application Priority Data

Jul. 31, 2000 (KR) ........................................ 2000-44178

(51) Int. Cl.$^7$ ................................................ C22C 1/00
(52) U.S. Cl. ........................ 148/537; 148/516; 148/618
(58) Field of Search ................................. 148/516, 518, 148/537

(56) References Cited

U.S. PATENT DOCUMENTS

| | | | | |
|---|---|---|---|---|
| 3,755,796 A | * | 8/1973 | Griest, Jr. ................. | 252/62.59 |
| 5,741,377 A | * | 4/1998 | Goyal et al. ................ | 148/512 |
| 6,117,689 A | * | 9/2000 | Summerfelt ................... | 438/3 |

OTHER PUBLICATIONS

The American College Dictionary, 1970, p. 1207.*

* cited by examiner

Primary Examiner—John P. Sheehan
(74) Attorney, Agent, or Firm—Welsh & Katz, Ltd.

(57) ABSTRACT

A method of manufacturing a metallic film consisting of giant single crystal grains is disclosed. The method includes depositing the metallic film on a substrate under an atmosphere of an inert gas and a specified additive gas to change a surface energy, grain boundary energy, or internal strain energy of the metallic film. The method also includes annealing step of the resultant of the deposition at a temperature suitable for the grain growth of the metallic film containing the additive gases. According to the method, the metallic film consisting of giant single crystal grains having a grain size whose ratio of thickness to an average grain size of the film is above 50 can be produced without depending upon the kind of substrate and deposition method.

6 Claims, 5 Drawing Sheets

METHOD OF MANUFACTURING METALLIC FILM CONSISTING OF GIANT SINGLE CRYSTAL GRAINS

BACKGROUND OF THE INVENTION

1. Field of the Invention

The present invention relates to a method of manufacturing a metallic film consisting of giant single crystal grains, and more particularly, to a method of manufacturing a metallic film consisting of giant single crystal grains on a substrate having no epitaxy relation to the metallic film to be deposited thereon.

2. Description of the Related Art

Recently, miniaturization of functional devices consisted of dielectric, piezo-electric, superconductive, and magnetic ceramic materials is becoming a world-wide tendency in order to meet the requirements of high-density integration, and functionality improvement of electronic ceramic parts or devices. For miniaturization of such devices comprised of ceramic thin film materials, single crystal materials such as silicon, MgO, $SrTiO_3$, $LaAlO_3$, and sapphire, and polycrystal materials such as alumina and diamond have been used as a substrate.

The above thin film materials and devices are mainly formed on a metallic film, which acts as the electrode, for driving of the devices or for signal processing. It has been reported that the single crystalline metallic film can remarkably increase the physical and electrical properties of the thin films to be deposited thereon. Up to now, single crystalline metallic films have been grown on single crystal substrates. However, this case cannot completely avoid problems (for example, residual stress, delamination from the substrate, change of interface characteristic, or the like) caused by lattice mismatch between the film and the substrates. Also, when a oxide single crystal substrate such as MgO, $SrTiO_3$, sapphire or the like is used instead of the substrate conveniently used such as Si wafer for the device fabrication, many problems occur during the integration of the devices.

Meanwhile, as a method of manufacturing bulk single-crystals of metal/non-metal materials a Czochralski growth, a floating-zone growth, or a melt-growth method is used. In case of the thin-film single crystal growth, a single crystal growth method for the bulk material cannot be used. Instead, a method using a epitaxial relation with the substrate is mainly used. In case of using the single crystal substrate, it is very important to have a lattice-matched substrate with that of the material to be grown thereon. If the difference between the lattice constants of the two materials is above about 15 percentages, the single crystal film cannot be grown.

As a result, in order to obtain a single crystal film, the kind of substrate is limited depending upon the deposited material. Furthermore, a limited deposition technique using expensive deposition equipment such as molecular beam epitaxy should be used, thereby increasing the production cost.

Meanwhile, in case of using the metallic film as a bottom electrode of various kinds of devices, its crystallographic characteristic has an profound effect on a preferred orientation or microstructure of the thin film material to be formed thereon, and this affects the characteristic of the manufactured devices. Specifically, when an oxide film is deposited on the metallic film, the nucleation of the oxide film occurs at grain boundaries or defect site of the metallic film having the lowest nucleation energy barrier. Accordingly, factors such as the existence/nonexistence of the grain boundary, density of the defects or the like of the metal lower electrode have an effect on the preferred orientation and microstructure of the oxide film, and this affects the physical property of the device. Accordingly, the crystallization and microstructure of the oxide film formed on the substrate can be controlled by regulating the orientation of the metallic film used as the electrode or substrate towards a specific crystallographic direction, and this can enhance the performance of the device. For the reason described above, many efforts to form a single crystal metallic electrode have been made by many researchers. Conventionally, a method using the single crystal substrate of MgO or $Al_2O_3$, or a method of forming an intermediate layer has been used. However, in case of method manufacturing any thin film device using a single crystal substrate such as MgO, it is not suitable for a silicon integrated circuit manufacturing process developed at present. Furthermore, processing of the substrate itself becomes difficult. Therefore, the use of the single crystal substrate, such as MgO, for manufacturing the device lacks practical application. In case of using the intermediate layer, the process is complicated, and the resultant metallic film is usually not of single crystalline, but is a film oriented in a certain direction, thereby limiting the control of the physical property of the oxide film. Accordingly, a method of forming giant metal grains, whose average grain size to thickness ratio is above 50 on a substrate having no epitaxy relation with the metal film is invented which has not been proposed yet.

FIG. 1A shows a conventional process of manufacturing a single crystal metallic film. It will be known from FIG. 1A that the epitaxial metallic film can be formed by depositing a metallic film 101 on a single crystal substrate 100 whose lattice mismatch is less than 15%.

In the above case, the material used as the substrate should not form a compound by reacting with the metallic film. However, Si wafer reacts with metal to form silicide, thereby interfering the single crystal growth of the metal film.

FIG. 1B shows another conventional process of manufacturing the single crystal metallic film. In FIG. 1B, in case that the single crystal substrate forms a compound by reacting with the metallic film, or the lattice mismatch is large, an intermediate layer 102 is employed. Such an intermediate layer 102 should have an epitaxy relation to the metallic film, and the lattice mismatch should be lowered.

SUMMARY OF THE INVENTION

Accordingly, the present invention is directed to a method of manufacturing a metallic film consisting of giant single crystal grains that substantially alleviates one or more problems due to limitations and disadvantages of the related art.

An object of the present invention is to provide a method of manufacturing a metallic film consisting of giant single crystal grains having a grain size that has a ratio of thickness to an average grain size of the metallic film of more than 50.

Another object of the present invention is to provide a method of manufacturing a metallic film consisting of giant single crystal grains having a grain size that has a ratio of thickness to an average grain size of the metallic film of more than above 50, without depending upon the kind of substrate or deposition method.

Still another object of the present invention is to provide a method of manufacturing a metallic film consisting of giant single crystal grains having a grain size that has a ratio of thickness to an average grain size of the metallic film of more than 50, and having a uniform orientation.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve the objects and other advantages and in accordance with the purpose of the invention, as embodied and broadly described herein, a method of manufacturing a metallic film consisting of giant single crystal grains, comprises a first step of depositing the metallic film on a substrate at an atmosphere of an inert gas and a specified additive gas to change a surface energy, grain boundary energy, or internal strain energy of the metallic film, and a second step of annealing the resultant of the first step at a temperature suitable for carrying out a grain growth of the metallic film containing the additive gas.

For a better understanding of the present invention, a poly-crystalline metal or ceramic material system is considered. During an annealing process of the materials, a grain growth occurs to reduce the total energy of the material. The grain growth is caused by the reduction of the interface energy and internal strain energy depending upon a grain size. In case of a thin film, the grain growth is also caused by the anisotropy of the surface energy because of the very large surface area to volume ratio of thin film, together with the interface and strain energies. The decrease of the interface energy as a typical driving force for a grain growth may cause the grain growth to a grain size of 2 to 3 times the thickness. However, the anisotropy of the surface energy or the strain energy as the driving force may cause a portion of grains oriented to a specific direction to be selectively grown. As the thickness of the thin film becomes thinner, the anisotropy of the surface energy plays a greater role. Accordingly, an FCC metallic thin film may have a (111) preferred orientation. Meanwhile, it has been reported that if a large strain energy is applied to the metallic film according to the deposition condition, the selective grain growth having a (200) orientation occurred, to reduce the strain energy. However, by the conventional driving force, such as strain energy, only a limited number of grains are largely grown in the entire thin film, and the size of the large grain is limited.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiment of the present invention, examples of which are illustrated in the accompanying drawings.

Figure 1A:
FIGS. 1A and 1B are cross sectional views illustrating a conventional process of manufacturing a single crystal metallic film.
Figure 1B:
Figure 2A:
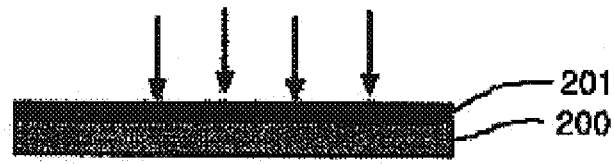
FIG. 2A is a cross sectional view illustrating a process of manufacturing a metallic film consisting of giant single crystal grains according to one embodiment of the present invention.

FIG. 2A shows a process of manufacturing a metallic film such as Pt, Au, Cu, Al, Ni, Ag, Ir, Pd, Ti, Ru, Ta, W, Os, or Rh, comprising giant single crystal grains according to one embodiment of the present invention.

Referring to FIG. 2A, a metallic film 201 for driving a electronic device or processing a signal is deposited on a substrate 200. The deposition process is executed under an atmosphere comprising an inert gas, i.e., argon, and a desired additive gas such as $O_2$, $N_2+O_2$, $N_2O$, Cl, or $N_2$ to change surface energy, grain boundary energy or internal strain energy of the metallic film.

If the substrate 200 is not reacted with the material of the metallic film 201 deposited thereon, any substrate made of amorphous or single crystal having a lattice mismatch of above about 15% may be used. According to the present invention, the process of depositing the metallic film 201 on the substrate is carried out by embodying any one of DC/RF magnetron sputtering, DC/RF sputtering, metal organic chemical vapor deposition, vacuum evaporation, laser ablation, ionized beam deposition, or electroplating.

The resultant deposited by the above process is annealed under a condition of $T/T_m > 0.5$, wherein T is an annealing temperature, and $T_m$ is a melting point of the metal.

Figure 2B:
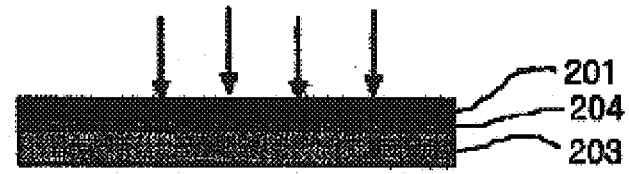
FIG. 2B is a cross sectional view illustrating a process of manufacturing a metallic film employing an intermediate layer according to another embodiment of the present invention.

FIG. 2B shows a process of manufacturing a metallic film according to another embodiment of the present invention, in which an intermediate layer is employed. Referring to FIG. 2B, a thermal oxide film 204 is interposed between a silicon substrate 203 and a metallic film 201. The thermal oxide film 204 prevents silicide from being formed between the silicon substrate 203 and the metallic film 201. In this case, the thermal oxide film 204 is amorphous, and has no any epitaxial relation to the metallic film deposited thereon. In the embodiment, except for the intermediate layer interposing between them, a process of annealing the metallic film 201 is carried out through the same condition as that of the embodiment shown in FIG. 2A.

Figure 2C:
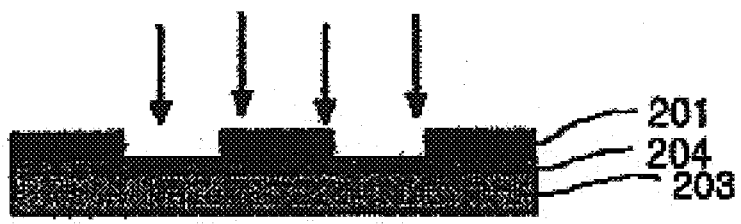
FIG. 2C is a cross sectional view illustrating a process of manufacturing metallic film employing a shadow mask according to still another embodiment of the present invention.

FIG. 2C shows a process of manufacturing a metallic film according to still another embodiment of the present invention, in which a patterning technique of the metallic film, including adopting shadow mask during the film deposition or photolithography and wet/dry etching of blanket deposited metallic film, is employed.

Referring to FIG. 2C, when executing the process shown in FIG. 2A, a metallic film 204 is selectively formed by a patterning technique of the metallic film, including adopting shadow mask during the film deposition or photolithography and wet/dry etching of blanket deposited metallic film. At that time, a single crystal film consisting of one grain can be obtained as shown FIG. 7.

Meanwhile, the metallic film produced by the process of the present invention as shown in FIGS. 2A to 2C consisting of giant single crystal grains having a ratio of thickness to an average grain size of above 50.

Explaining the reason, when the metallic film is deposited as shown in FIGS. 2A to 2C, the additive gas is incorporated into the metallic film, depending upon the reactivity and atomic size of the additive gas. As the additive gas is added, incorporation of the added gas into the lattice or formation of compound varies the surface and grain boundary energies of the metallic film.

The gas incorporation or compound formation in the metallic film due to the additive gas causes the surface energy, grain boundary energy and strain energy of the metallic film to be varied, thereby having a serious effect on the grain growth behavior of the metallic film during an annealing process.

Figure 3A:
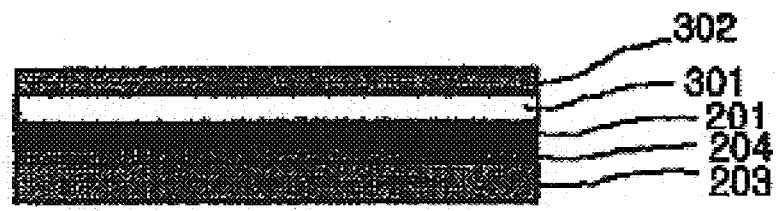
FIG. 3A is a cross sectional view illustrating a device deposited on a metallic film produced according to the present invention.

FIG. 3A shows a device deposited on the metallic film produced by the present invention.

Specifically, in FIG. 3A, an oxide film 301 and an upper electrode 302 are deposited on the resultant of FIG. 2B. In this case, the oxide film 301 is deposited on the metallic film 201, which serves as a bottom electrode, produced according to the present invention. The metallic film is deposited in a way that it has an effect on the nucleation, the microstructure, the preferred orientation or the like to improve the electrical and physical property of the device produced thereon.

Figure 3B:
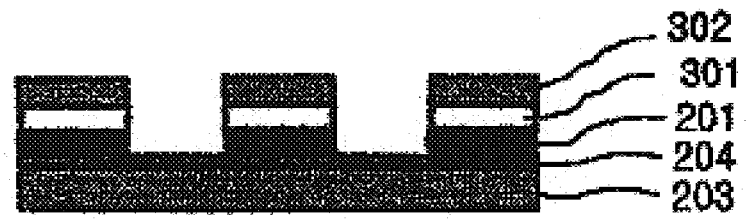
FIG. 3B is a cross sectional view illustrating a device deposited on a metallic film consisting of giant single crystal grains produced according to the present invention using a shadow mask.

FIG. 3B shows a device fabricated on the metallic film consisting of a giant single crystal grains produced according to the present invention using the patterning technique, specifically a shadow mask.

Specifically, in FIG. 3B, the oxide film 301 and the top electrode 302 are deposited on the metallic film shown in FIG. 2C using the patterning technique, specifically a shadow mask.

Figure 4:
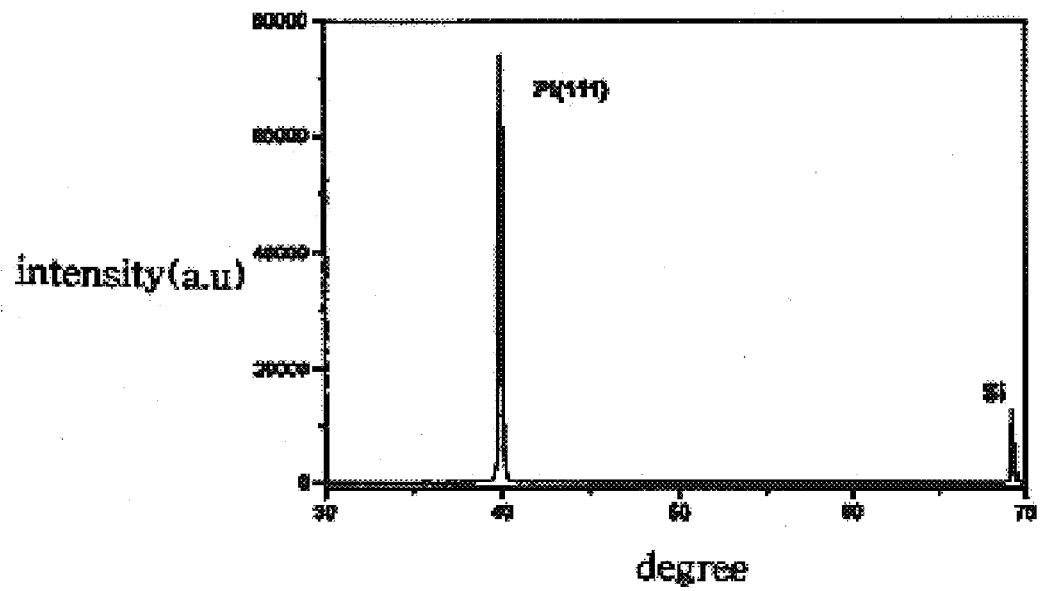
FIG. 4 is a graph showing an x-ray diffraction (XRD) pattern of a platinum film produced according to the present invention.

FIG. 4 shows an x-ray diffraction (XRD) pattern of a platinum film produced according to the present invention.

As shown in FIG. 4, a (111) preferred orientation of platinum is observed from the peak at 39.6 degrees of two theta angle. The small half width of the peak indicates that the film is well oriented with (111) orientation.

Figure 5A:
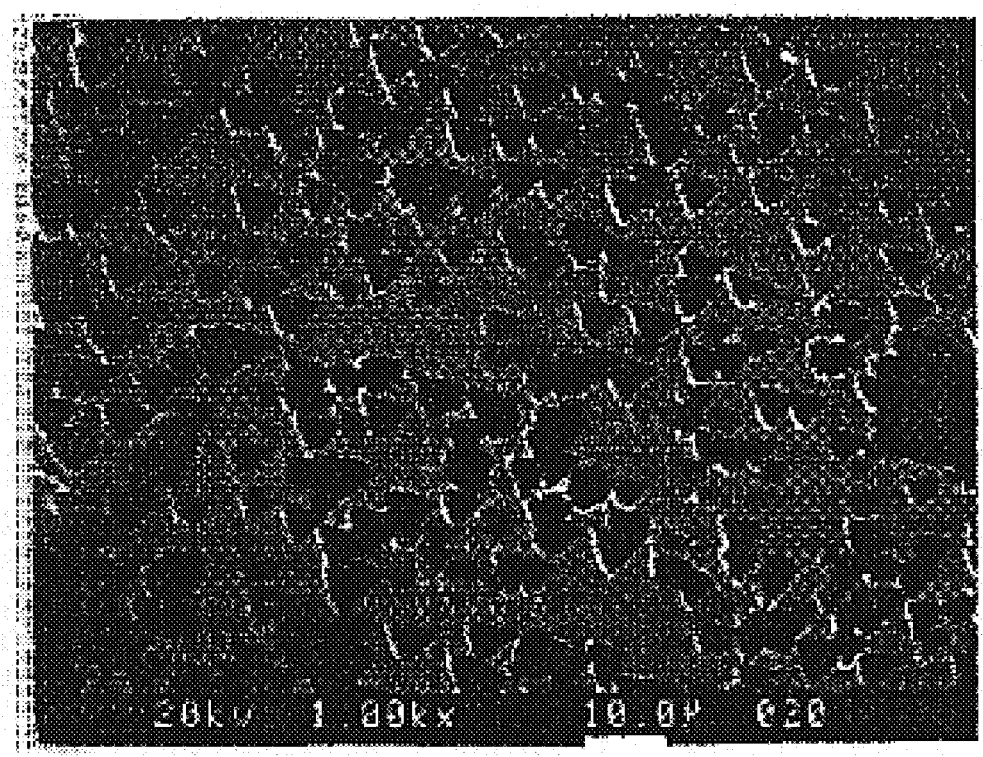
FIG. 5A is a SEM (scanning electron microscope) photograph showing an etch pit pattern of a platinum single crystal film having a (111) orientation produced according to the present invention.

FIG. 5A is a SEM (scanning electron microscope) photograph showing an etch pit pattern of a platinum single crystal film having the (111) orientation produced according to the present invention.

Referring to FIG. 5A, it will be known that the platinum single crystal film of the present invention is a single crystal grain having the (111) orientation, in view of the uniformly formed etch pit pattern in the single crystal film.

Figure 5B:
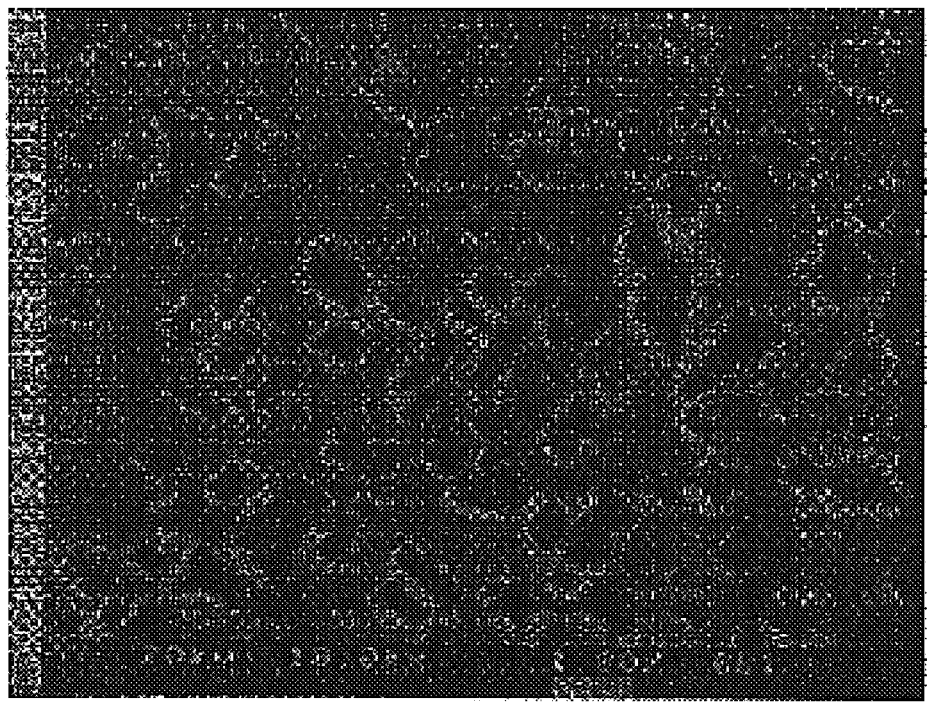
FIG. 5B is a SEM (scanning electron microscope) photograph showing an etch pit pattern of a platinum single crystal film having a (200) orientation produced according to the present invention.

FIG. 5B is a SEM (scanning electron microscope) photograph showing an etch pit pattern of a platinum single crystal film having a (200) orientation produced according to the present invention.

FIG. 5B shows a rectangular etch pit pattern different from that of the single crystal grain having the (111) orientation shown in FIG. 5A, in which it will be known that the etch pit orientation is uniform. As shown in FIGS. 5A and 5B, the orientation of the single crystal grains of the present invention can be controlled to a desired direction.

Figure 6A:
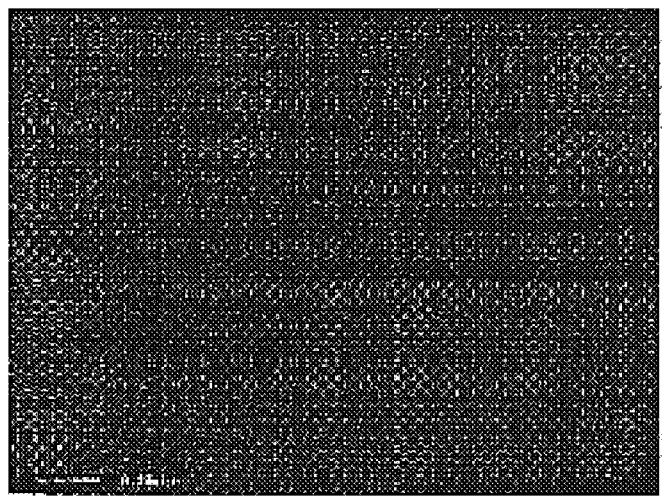
FIGS. 6A and 6B are optical microscope photographs of the single crystal grain obtained according to the present invention.
Figure 6B:
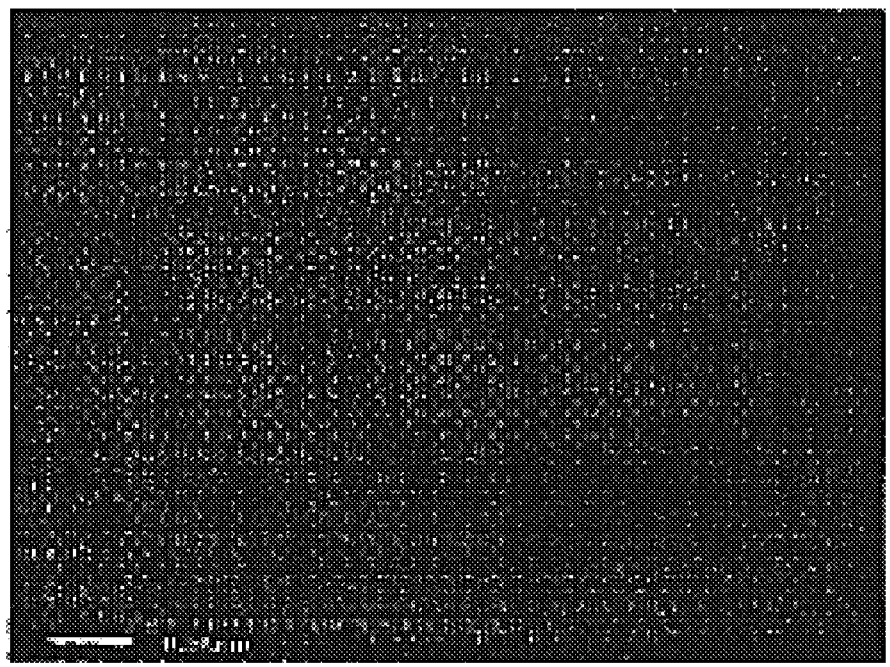

FIGS. 6A and 6B are optical microscope photographs of the single crystal grain obtained according to the present invention, and shows the single crystal grains having a grain size of above 1 mm with a thickness of 1 $\mu$m.

Figure 7:
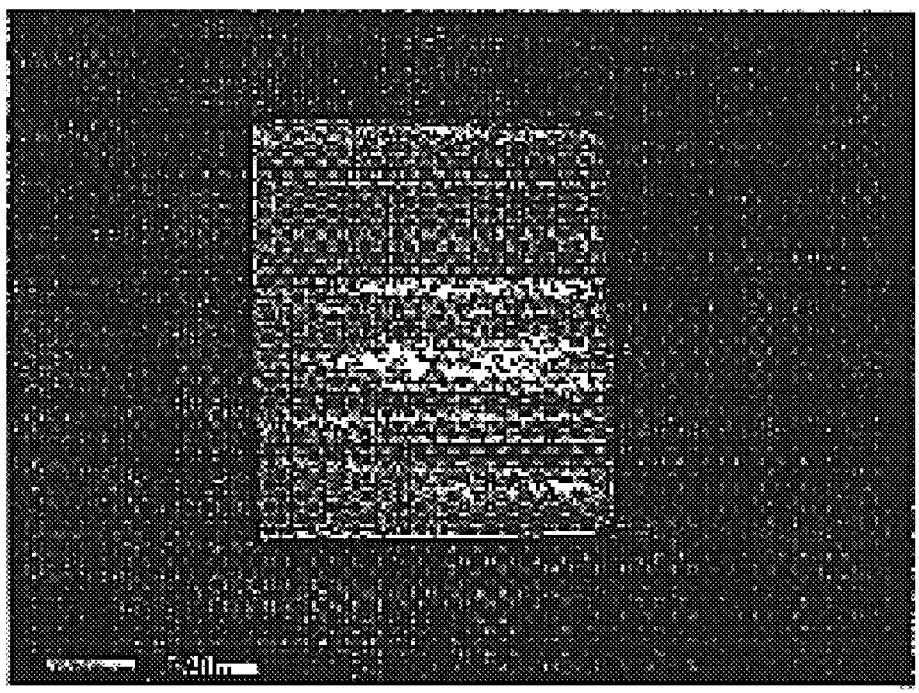
FIG. 7 is a optical microscope photograph of a metallic film produced using a shadow mask according to the present invention.

FIG. 7 is an optical microscope photograph of a metallic film of 0.8×0.9 mm$^2$ produced using the shadow mask according to the present invention. It will be known that any grain boundary is not observed, and the metallic film is consisting of the single crystal grain having the (111) orientation.

The advantage and effect of the present invention will be explained by the following examples.

EXAMPLE 1

A thermal silicon oxide layer was formed on a silicon substrate, and a platinum film was formed on an upper surface of the thermal silicon oxide layer with a thickness of 1 $\mu$m. The thermal silicon oxide layer is an amorphous layer, and has no epitaxial relation to the platinum.

Depositing method: DC magnetron sputtering

Atmosphere: Ar+O$_2$ (a partial pressure ratio of Ar:O$_2$ is 90%:10%)

Substrate temperature: room temperature

Thickness: 1 $\mu$m

Annealing process: for 1 hour at 1,000° C.

As the result, the platinum film having a ratio of thickness to an average grain size of above 100 was obtained, as shown in FIGS. 6A and 6B.

EXAMPLE 2

A thermal silicon oxide layer was formed on a silicon substrate, and a platinum film was formed on an upper surface of the thermal silicon oxide layer with a thickness of 1 $\mu$m. The thermal silicon oxide layer is an amorphous layer, and has no epitaxial relation to the platinum. When depositing the platinum, a rectangular dot of 0.8×0.9 mm$^2$ was formed using a shadow mask, and the resultant was annealed at a temperature of 1,000° C. for 1 hour.

Deposition method: DC magnetron sputtering

Atmosphere: Ar+O$_2$ (a partial pressure ratio of Ar:O$_2$ is 90%:10%)

Substrate temperature: room temperature

Thickness: 1 $\mu$m

Annealing process: for 1 hour at 1,000° C.

As the result, a single crystal grain of the platinum film was obtained, as shown in FIG. 7.

From the above examples, it can be understood that the formation of the platinum film having giant single crystal grains, whose ratio of thickness to an average grain size is above 50, is possible according to the present invention, even in case of employing the substrate having no epitaxial relation to the platinum film.

With the present invention, the metallic film having giant single crystal grains, whose ratio of thickness to an average grain size is above 50, can be produced by varying the surface energy, grain boundary energy, internal strain energy of the metallic film, and controlling the driving force for the grain growth during the annealing process.

The present invention can be employed in device fabrication using the oxide film. Since the production of the metallic film is hardly dependent upon the kind of substrate or deposition method, the metal single crystal film can be easily and inexpensively grown.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a metallic film consisting essentially of a giant single crystal grain, consisting essentially of the steps of:

depositing the metallic film directly on a substrate in an atmosphere of an inert gas and a specified additive gas to change a surface energy, grain boundary energy, or internal strain energy of the metallic film; and annealing the resultant metallic film of the first step at a temperature suitable for carrying out a grain growth of the metallic film containing the additive gas and controlling the grain size of the giant crystal grain so the giant single crystal grain has a grain size with a ratio of thickness to an average grain size of the metallic film of more than 50 to 1.

2. In the method as claimed in claim 1, the change of the surface energy, grain boundary energy, or internal strain energy of the metallic film is performed by incorporating the additive gas to the metallic film, or production of a compound between the additive gas and the metallic film.

3. The method as claimed in claim 1, wherein the deposition of the metallic film is performed by a process selected from the group consisting of a DC/RF magnetron sputtering, DC/RF sputtering, metal organic chemical vapor deposition, vacuum evaraporaion, laser ablation, ionized beam deposition, and electroplating.

4. The method as claimed in claim 1, wherein the additive gas is selected from the group consisting of $O_2$, $N_2+O_2$, $N_2O$, Cl, and $N_2$.

5. The method as claimed in claim 1, wherein the metallic film is selected from the group consisting of Pt, Au, Cu, Al, Ni, Ag, Ir, Pd, Ti, Ru, Ta, W, Os, and Rh.

6. A method of manufacturing a metallic film comprising a single crystal grain comprising the steps of:

depositing a metallic film on a substrate while controlling the grain size of the single crystal grain and annealing the metallic film so that the single crystal grain has a grain size with a ratio of thickness to an average grain size of the metallic film of more than 50 to 1.

* * * * *